United States Patent [19]
McManus et al.

[11] Patent Number: 5,087,479
[45] Date of Patent: Feb. 11, 1992

[54] METHOD AND APPARATUS FOR ENVELOPING AN ELECTRONIC COMPONENT

[75] Inventors: Patrick McManus, Munich; Rudolf Kutscherauer, Forstern, both of Fed. Rep. of Germany

[73] Assignee: Siemens Aktiengesellschaft, Munich, Fed. Rep. of Germany

[21] Appl. No.: 533,387

[22] Filed: Jun. 5, 1990

[30] Foreign Application Priority Data

Jun. 5, 1989 [DE] Fed. Rep. of Germany ....... 3918315

[51] Int. Cl.$^5$ .................... B05D 3/06; B05D 5/12; B05D 1/02; B29C 00/00
[52] U.S. Cl. .................... 427/54.1; 427/58; 427/258; 427/407.1; 427/421; 264/272.13; 264/272.14; 264/279; 264/279.1
[58] Field of Search ....... 264/272.11, 272.13, 264/272.14, 272.15, 272.16, 279, 279.1; 427/53.1, 421, 407.1, 58, 258, 372.2, 379, 54.1

[56] References Cited

U.S. PATENT DOCUMENTS

| | | | |
|---|---|---|---|
| 3,579,821 | 5/1971 | Kurisu | 264/272.14 |
| 3,622,419 | 11/1971 | London et al. | 264/272.11 |
| 4,567,006 | 1/1986 | Covington et al. | 264/272.16 |
| 4,711,688 | 12/1987 | Pienimaa | 264/272.13 |
| 4,843,036 | 6/1989 | Schmidt et al. | 264/272.11 |
| 4,880,663 | 11/1989 | Shimada | 427/421 |
| 4,927,580 | 5/1990 | Nasu et al. | 264/272.13 |

FOREIGN PATENT DOCUMENTS

| | | |
|---|---|---|
| 2637105 | 2/1978 | Fed. Rep. of Germany . |
| 3442131 | 5/1986 | Fed. Rep. of Germany . |
| 3732462.4 | 3/1987 | Fed. Rep. of Germany . |
| 3833276.0 | 4/1987 | Fed. Rep. of Germany . |

*Primary Examiner*—Michael Lusignan
*Assistant Examiner*—Marianne L. Padgett
*Attorney, Agent, or Firm*—Hill, Van Santen, Steadman & Simpson

[57] ABSTRACT

A method forming a compressible intermediate layer between a chip and a chip envelope provides that an ultraviolet-curable gel that is metered onto the chip with a multiple needle arrangement. The multiple needle arrangement is conducted over the chip surface with varying moving directions and, under certain circumstances, with varied speeds as well. After the application of the gel, the layer is pre-cured on a strips of ultraviolet light that follows the multiple needle arrangement at a defined distance therefrom.

8 Claims, 1 Drawing Sheet

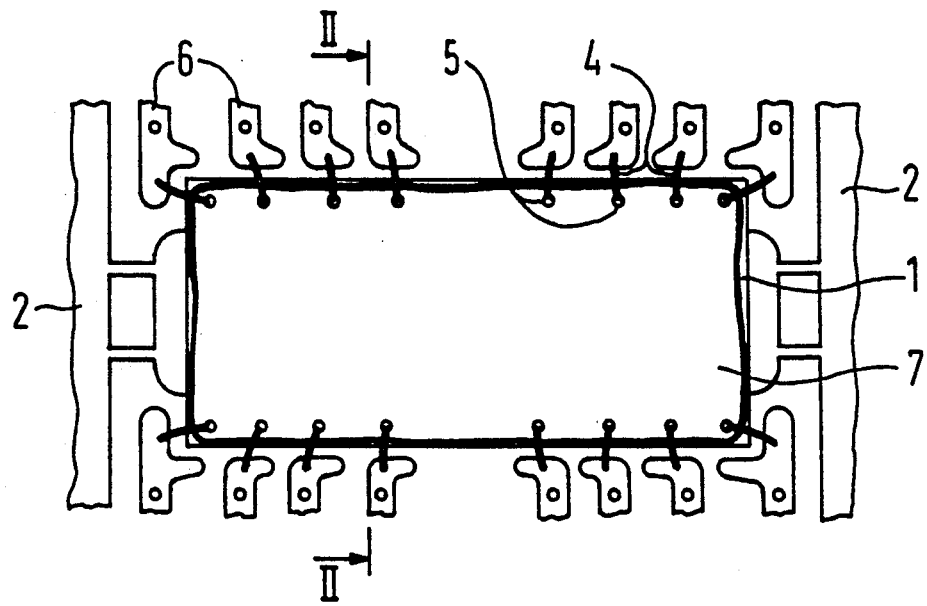
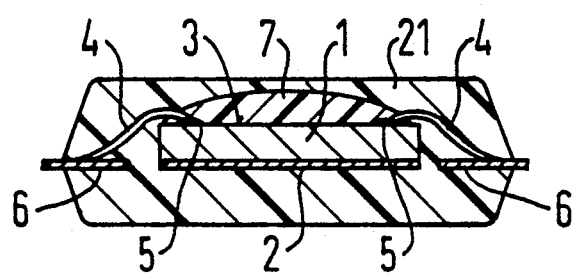
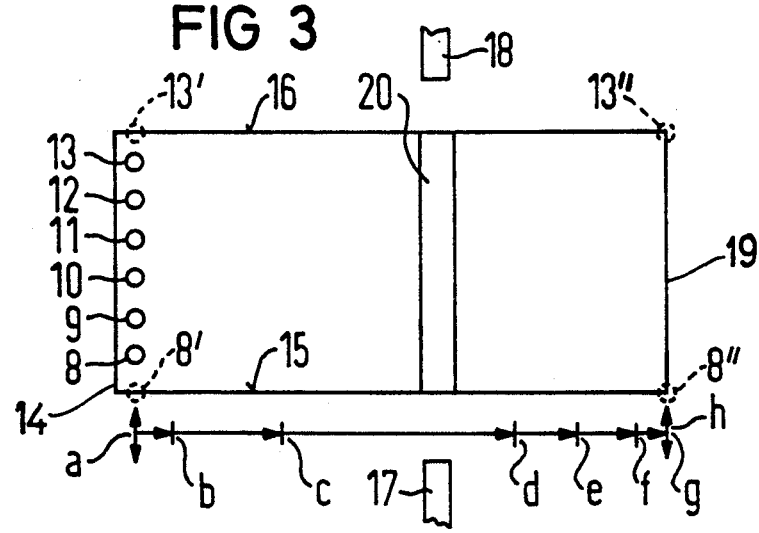

METHOD AND APPARATUS FOR ENVELOPING AN ELECTRONIC COMPONENT

BACKGROUND OF THE INVENTION

1. Field of the Invention

The present invention is related generally to a method for enveloping an electronic component that has a generally planar form with two base surfaces lying opposite one another in which bond wires proceed from one of the two base surfaces and, in particular to a method in which a flowable gel is applied to the base surface of the electronic component to form an intermediate layer which is then surrounded by an enveloping compound.

2. Description of the Related Art

An enveloping technique for electronic components is disclosed in published European patent application 88 11 3887.9.

Sensitive components such as complex integrated circuits are usually enveloped with a plastic compound to protect them against detrimental environmental effects. Such plastic compounds, also referred to as enveloping compounds, have been previously developed and provide a reliable shield for the component from atmospheric influences, but these enveloping compounds are not particularly well adapted to the thermal expansion properties of the chip material so that unacceptably high mechanical stresses can be placed on the component, particularly when great fluctuations in operating temperatures occur. Therefore, in some instances, the chip surface has been covered with an elastic and compressible intermediate layer which compensates for differences in thermal expansion and, thus, enables a wider selection of the various enveloping plastics to be used.

The enveloping technique disclosed in European patent application 88 11 3887.9 proposes the use of a variety of materials and application methods for the intermediate layer. For example, the manual application of ultraviolet-curable silicone rubber or the dosed application of a polyether urethane is proposed. To provide a surface covering of a dosed material, the intermediate coating compound is forced through a hollow needle that is guided in a meandering path over the chip, or it is forced through a slot-shaped nozzle.

In practice, the substances and application techniques disclosed in published European patent application 88 11 3887.9 provide definitely satisfactory results for small-area chips. However, for chip areas of approximately one square centimeter or more, the known techniques do not succeed in reliably covering the edge regions of the chip without further ado, these edge regions being inherently in need of special protection against mechanical influences due to the sensitive bond wire connections. The principle reason for the lack of adequate covering in the edge regions of the chips is that the applied plastic material contracts to a drop shape relatively quickly due to surface tension.

When it is important that the external surface of the enveloped component is flat, a further disadvantage is present using the known practice since the intermediate layer has contracted or flowed together with sufficient thickness toward the middle of the chip that in certain circumstances the middle of the chip may no longer be coated by the enveloping compound and the intermediate layer may emerge from the enveloping compound to a more or less pronounced degree. In this case, the component is no longer completely encapsulated and, moreover, does not have the prescribed shape.

Theoretically, there are a number of possibilities for preventing or eliminating the formation of drops. The intermediate layer may be realized in an injection molding process. Such technique provides a well-defined layer profile and can also be automated. However, injection molded processes require injection molding tools that are constructed in relatively complicated ways and, in addition, the process is rather time consuming and does not allow the layer to be limited to only the chip surface without further ado. Thus, the entire bond wires including their contacts together with the terminal legs are coated by the intermediate layer material, which must be strictly avoided in certain types of chips.

It is also conceivable to drip the intermediate layer material onto the center of the area to be coated and then distribute the material by rotating the component, as in German patent document DE AS 26 37 105. Finally, there is an alternative process disclosed in German published application 34 42 131 in which a sealable substance is poured over the chip and then the material mass is pressed into the desired shape with a foil that is pressed onto the mass under elevated temperatures. It is obvious that the two foregoing methods are so involved that they actually do not come into consideration for mass production.

SUMMARY OF THE INVENTION

It is an object of the present invention to apply an intermediate layer for enveloping an electronic component such that the intermediate layer covers the entire chip surface to the corners of the chip and thereby preserves a relatively planer profile of the chip component. Accordingly, the application of the intermediate layer is reliable, utilizes an optimally small amount of compound material for the layer and, last but not least, is suitable for manufacturing on an industrial scale.

These and other objects and advantages of the present method are achieved by applying an ultraviolet curable gel through a plurality of nozzles lying side-by-side in a row along an axis, moving the row of nozzles back and forth along the axis above a starting edge of the component and parallel to the starting edge, subsequently conducting the row of nozzles across the cover surface of the component to a stop edge thereof, and then curing the intermediate layer by irradiation with a stripe of ultraviolet light extending parallel to the starting edge of the chip which is conducted over the cover surface from the starting edge to the stop edge at a prescribed distance from the nozzle row.

Tests have shown that the metered application of the gel according to the present invention, wherein a number of application locations are collectively guided over the surface of the chip in a defined motion pattern along with an accompanying application of ultraviolet curing radiation at a prescribed time interval, yields layer profiles that meet high demands with respect to minimum thickness in the edge region and permissible maximum thickness at the center area of the chip. The present metering technique is thereby so gentle that the bond wire connections of the chip are not harmed.

All of the individual steps of the present process can be automated and can be expanded to form a fully automatic encapsulation process. Overall, the intermediate layer can be realized in less than ten seconds, particularly when ultraviolet curing is implemented only to such an extent in a first pre-curing step that the layer material looses its flowability. Such fast processing is possible when a second step is added wherein a plurality of the components, such as all of the chips in a lead frame, are simultaneously cured in the second step, a process that typically requires another approximately 20 seconds.

Depending upon the conditions for the individual situation, it may be recommendable to modify the individual perimeters of the present method. Thus, it may be meaningful to conduct the row of nozzles back and forth parallel to the stop edge while the nozzles are still above the stop edge. Over and above this, it is often expedient to interrupt the emergence of the gel one or more times such as, for example, for a short distance at the beginning of the step in which the nozzle row is conducted over the chip surface. Furthermore, it is definitely possible to vary the speed of the nozzle row as it is conducted over the chip. The best results are often achieved when the movement of the nozzle row over the chip is started at a relatively high speed, subsequently switched to a lower speed, and then again increased in speed when a major portion of the chip is already coated.

The method according to the present invention is especially simple to implement when the nozzles, which are usually hollow needles, are attached at a fixed special distance on, for example, a common carriage together with the ultraviolet light source used for the pre-curing step, wherein the nozzles are at a fixed spacial distance from the light source.

Further advantages, developments and improvements of the invention are achieved by moving the nozzle row back and forth above the stop edge of the chip parallel to the alignment axis of the nozzles. Another advantage is achieved by interrupting the flow of gel emerging from the nozzles at the beginning of the movement of the nozzle row across the cover surface of the chip. It also provides improvements when the flow of gel emerging from the nozzles is interrupted during movement of the nozzles back and forth above the stop edge of the chip.

The present invention encompasses varying the speed at which the nozzles are conducted across the cover surface of the chip and, in particular, first decreasing the speed of the nozzles during movement of the nozzle row across the cover surface of the chip up to the stop edge thereof and then again increasing the speed. It is contemplated in the present invention to merely pre-cure the intermediate layer by irradiation with ultraviolet light and then to subsequently cure this component together with further components that have pre-cured intermediate layers in the same work cycle.

An apparatus for implementing the present method provides a carriage on which nozzles and a pre-curing ultraviolet light source are mounted at a fixed spacial distance from one another. The apparatus may also include a second carriage which carries the chip to be coated so that, as the first carriage is being returned to its initial position after the pre-curing step has been carried to reposition the nozzle row above the starting edge in the initial position, the second carriage may move the chip component that has been provided with the intermediate layer in a forward direction parallel to the starting edge during the return of the first carriage to simultaneously bring a new component into position.

The nozzles on the first carriage are preferably hollow needles. The preferred form of the ultraviolet light source includes two light conductors having their ends positioned above the intermediate layer level, each outputting a light beam inclined relative to the intermediate layer level.

BRIEF DESCRIPTION OF THE DRAWINGS

FIG. 1 is a plan view of a chip which has already been coated with an intermediate layer but which has not yet been detached from a lead frame, the system carrier and the terminal legs being partially broken away;

FIG. 2 is a cross section along line II—II of the chip of FIG. 1 after the chip is enveloped and detached; and FIG. 3 is a schematic representation of a plan view of a chip illustrating the sequence of the various steps in the present method for manufacture of an intermediate layer.

DESCRIPTION OF THE PREFERRED EMBODIMENTS

A component 1 is illustrated in FIGS. 1 and 2 which is, for example, an enveloped four megabyte memory component. The actual memory component 1 is a chip having a size of 15 mm by 7 mm and is fixed on a system carrier, or lead frame, 2. A surface 3 of the memory component 1 facing away from the system carrier 2 includes bond wires 4 which extend from the edges and corners of the chip and which contact the chip with one end that is formed as a nail head 5. An opposite end of the bond wire is in contact with a terminal leg 6 in the lead frame. The entire top chip surface 3 is coated with an intermediate layer 7 that covers the nail heads 5 with a certain minimum thickness and is only slightly arched toward the middle of the chip. The overall arrangement is encapsulated within an envelope 21 from which the terminal legs 6 project to form the finished component.

The intermediate layer 7 is formed in the following way: The chip 1 is usually integrated in a band shaped lead frame together with other chips and is placed under a gel dispenser. A gel dispenser includes six hollow needles 8–13 as shown in FIG. 3 arranged side by side in a row. The needles 8–13 are spaced from one another such that they nearly cover the entire narrow side edge 14 of the chip surface lying thereunder. Dispensers connected to the dispensing needles 8–13 are filled with a gel, such as a gel of the type distributed by Dow Corning under the designation DC 7551-70Q. This gel is a solvent free, single component silicon gel that cures under ultraviolet light. The needles 8–13 are lowered to a defined distance from the bond wire arches 4 before dispensing of the gel is undertaken. The gel is then forced through the hollow needles 8–13 at a defined pressure.

The process execution is empirically calculated depending upon the chip area and on the design. As already mentioned, the moving directions and the speeds of the multiple needles, the on and off times of the dispenser and the spacial-chronological positioning of the following ultraviolet light source play a significant part in the process.

In the present example, the multiple needle arrangement 8–13 is situated over the starting edge 14 of the chip and is moved back and forth, as indicated by the double arrow a along the starting edge 14. The movement direction of the needle row also proceeds parallel to the direction in which the needle row extends. This movement of the needle row is carried out after the dispenser is turned on to emit the gel. The stroke length of the motion is of such size that the outer hollow needles 8 and 13 proceed over the chip edges 15 and 16 as indicated by positions 8' and 13', the chip edges 15 and 16 lying at right angles relative to the starting edge 14 as a first sub-step.

After the initial sub-step, the needle row is conducted in the direction of the edges 15 and 16 with a relatively high speed $V_1$, whereby the dispenser is initially shut off for a certain time during which the needle row 8-13 moves up to point b. The reason for interrupting the operation of the dispenser is that the gel which has been liberally applied at a flow edge of the component 1 so that the layer material also deposits on the neighboring chip area with the effect that it decreases with increasing distance from the starting edge.

In the following step that begins at point b and ends a point c, the dispenser row 8-13 remains moving at the moving speed $V_1$ and the dispenser is again turned on. During the following step which the needle row 8-13 is moved from point c to point d, the moving speed is throttled to a lower value $V_2$. The reduction in the speed of the needle row is required because no additional gel proceeds onto this surface zone from the edge region.

In the following step, the needle row 8-13 moves from point d to point e and the ultraviolet light source is switched on. This light source is an ultraviolet point radiator provided with two light conductors 17 and 18. The spectrum of the ultraviolet radiation is limited by a filter to a wavelength range adapted to the gel being used as the intermediate layer. The light conductors 17 and 18 of the present device are positioned at a defined distance. In this position, the light conductors 17 and 18 irradiate the intermediate layer in a stripe 20 that proceeds parallel to the starting edge 14 of the chip. Both light conductors 17 and 18 are conducted over the chip surface with the same speed as the needle row 8-13 and are set such that the ultraviolet energy from the light conductors 17 and 18 pre-cure the irradiated gel stripes to prevent the gel stripes from flowing farther. At the moment that the ultraviolet source is switched on, the stripe is situated in a region of the start edge 14.

While the needle row 8-13 migrates from the point e to a point f, the moving speed is returned to the original value $V_1$. Over the final distance from point f to point g at the stop edge 19 of the chip lying opposite the starting edge 14, the gel delivery is striped and the needle speed is then reduced to the value $V_2$. This variation in speed serves to further level the layer thickness.

The moving direction changes above the stop edge 19; as in the first step, the needle row 8-13 is moved back and forth, as illustrated by double arrow h, parallel to the edges 14 and 19 so that the outer needles 8 and 13 reach the positions 8" and 13". The needles 8-13 are subsequently raised. When the exposure stripe 20 that follows the needle row 8-13 has also reached the stop edge 19, the ultraviolet light is shut off. The dispenser and the ultraviolet light source are then moved back into their initial positions in the directions of the edges 15 and 16. The chip 1 is simultaneously moved farther along in a direction of the edges 14 and 19 so that a neighboring chip comes to lie under the row of needles 8-13.

When all of the chips of a lead frame have been coated with the intermediate layer, the chips are ultimately cured together with an ultraviolet light for approximately 20 seconds. Subsequently, the chips of the lead frame are encapsulated in a standard way using a thermal setting or a thermal plastic compound and the components are finally detached from one another.

A series of tests shown that the intermediate layers produced in this fashion regularly have a defined minimum thickness above the particularly critical humps at the chip corners and also lie under a defined maximum thickness in the middle of the chips.

The method of the invention is not limited to the exemplary embodiments set forth in detail here. It is contemplated for use with other components and even for hybrid circuits under certain circumstances. It remains at the discretion of the person of skill in the art to provide a lining of a further layer of, for instance, a polyimide under the intermediate layer.

Although other modifications and changes may be suggested by those skilled in the art, it is the intention of the inventors to embody within the patent warranted hereon all changes and modifications as reasonably and properly come within the scope of their contribution to the art.

We claim:

1. A method for enveloping an electronic component having a generally planar shape with two generally planar surfaces on opposite sides thereof and bond wires proceeding from a first of the two generally planar surfaces, comprising the steps of:

applying a flowable gel onto the first of said two generally planar surfaces having the bond wires, through a plurality of nozzles arranged side-by-side in a row along an alignment axis to form an elastic and compressible intermediate layer of the flowable gel, the flowable gel comprising an ultraviolet-curable gel;

moving the row of the plurality of nozzles back and forth above a starting edge of the electronic component in a direction generally parallel to the starting edge to cover the starting edge with the gel;

conducting the row across the first one of the two generally planar surfaces to an edge of the electronic component that lies opposite the starting edge;

moving an ultraviolet light directed in a strip extending generally parallel to the starting edge of the electronic component from the starting edge to the edge opposite the starting edge at a prescribed spacial distance from the row of the plurality of nozzles from which the gel is discharged to pre-cure the gel applied in the preceding steps by irradiation so that a prescribed time interval is present between the discharge of the gel and the pre-curing by the light so as to set the flowable gel at the locations at which it is supplied by the nozzle row; and applying a surrounding layer of an enveloping compound over the elastic and compressible intermediate layer formed by the pre-cured flowable gel.

2. A method according to claim 1, further comprising the step of:

moving the row of the plurality of nozzles back and forth above the edge of the electronic component opposite the starting edge in a direction generally parallel to the alignment axis of the row.

3. A method as claimed in claim 2, further comprising the steps of:

interrupting a flow of the flowable gel from the plurality of nozzles during said step of moving the row above the edge opposite the starting edge.

4. A method as claimed in claim 1, further comprising the step of:

interrupting a flow of the flowable gel from the plurality of nozzles during a beginning of said step of conducting said row across said first one of said two generally planar surfaces.

5. A method as claimed in claim 1, further comprising the step of:

varying a moving speed of said row during said step of conducting the row across the first one of the two generally planar surfaces.

6. A method as claimed in claim 5, further comprising the step of:

first diminishing and then increasing said moving speed during said step of varying.

7. A method as claimed in claim 1, wherein said step of pre-curing merely pre-cures the intermediate layer formed by the flowable gel, and further comprising the step of:

finally curing the intermediate layer on a plurality of components that have been pre-cured in a same work cycle, said step of finally curing being performed before said step of applying a surrounding layer.

8. A method for enveloping an electronic component having a generally planar surface, comprising the steps of:

applying an intermediate layer of a flowable material onto said generally planar surface of the electronic component from at least one nozzle being moved above and along said generally planar surface;

moving said at least one nozzle back and forth above a starting edge of the electronic component in a direction generally parallel to said starting edge prior to moving said at least one nozzle above and along said generally planar surface in the preceding step; and moving a strip of radiation directed onto said intermediate layer generally parallel to said starting edge across said generally planar surface in a direction from said starting edge to an opposite edge of said electronic component to pre-cure said intermediate layer, said strip of radiation being maintained at a prescribed distance from said at least one nozzle so that the prescribed distance is present between the application of the gel and the pre-curing to set the flowable gel at the locations at which it is supplied by the nozzle row.

* * * * *